(12) United States Patent
Peltonen et al.

(10) Patent No.: US 10,868,543 B2
(45) Date of Patent: *Dec. 15, 2020

(54) OSCILLATOR CIRCUIT WITH BIAS CURRENT GENERATOR

(71) Applicant: Telefonaktiebolaget LM Ericsson (publ), Stockholm (SE)

(72) Inventors: Janne Peltonen, Salo (FI); Christian Elgaard, Lund (SE); Anna-Karin Stenman, Hjärup (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 16/412,777

(22) Filed: May 15, 2019

(65) Prior Publication Data

US 2019/0268002 A1   Aug. 29, 2019

Related U.S. Application Data

(63) Continuation of application No. 15/314,843, filed as application No. PCT/EP2014/061407 on Jun. 2, 2014, now Pat. No. 10,333,526.

(51) Int. Cl.
*H03L 3/00* (2006.01)
*H03B 5/32* (2006.01)
*H03L 5/00* (2006.01)

(52) U.S. Cl.
CPC .............. *H03L 3/00* (2013.01); *H03B 5/32* (2013.01); *H03L 5/00* (2013.01);
(Continued)

(58) Field of Classification Search
CPC .............. H03B 5/32; H03B 2200/0012; H03B 2200/0066; H03B 2200/0082;
(Continued)

(56) References Cited

U.S. PATENT DOCUMENTS 6,052,036 A   4/2000   Enstroem et al.
6,563,891 B1  5/2003   Eriksson et al.
(Continued)

FOREIGN PATENT DOCUMENTS

EP   0724331 A1   7/1996
EP   1791252 A1   5/2007
(Continued)

*Primary Examiner* — Arnold M Kinkead
(74) *Attorney, Agent, or Firm* — Murphy, Bilak & Homiller, PLLC

(57) ABSTRACT

An oscillator circuit comprises a crystal oscillator arranged to generate an oscillation signal, a bias current generator arranged to supply a bias current to the crystal oscillator, and a feedback stage arranged to generate a feedback signal in response to an amplitude of the oscillation signal reaching an amplitude threshold. The bias current generator is arranged to: in response to a supply of power to the oscillator circuit being switched on, generate the bias current at an increasing level commencing from a first level; in response to the feedback signal, terminate the increasing; and during subsequent oscillation of the crystal oscillator, supply the bias current at a second level dependent on a final level of the bias current reached when the increasing is terminated.

13 Claims, 4 Drawing Sheets

(52) U.S. Cl.
CPC .............. *H03B 2200/0012* (2013.01); *H03B 2200/0062* (2013.01); *H03B 2200/0066* (2013.01); *H03B 2200/0082* (2013.01); *H03B 2200/0094* (2013.01)

(58) Field of Classification Search
CPC .... H03B 2200/0094; H03B 2200/0062; H03L 3/00; H03L 5/00
USPC ............................ 331/116 FE, 185, 182, 158
See application file for complete search history.

(56) References Cited

U.S. PATENT DOCUMENTS

| | | |
|---|---|---|
| 6,798,301 B1 | 9/2004 | Balan et al. |
| 7,292,114 B2 | 11/2007 | Greenberg |
| 7,482,888 B1 | 1/2009 | Kleveland |
| 7,486,153 B2 | 2/2009 | Castex |
| 8,120,439 B2 | 2/2012 | Shrivastava et al. |
| 8,729,971 B2 | 5/2014 | Kubota et al. |
| 10,333,526 B2 * | 6/2019 | Peltonen .................. H03B 5/32 |
| 2007/0096841 A1 | 5/2007 | Connell et al. |
| 2009/0079510 A1 | 3/2009 | Widmer |
| 2011/0074499 A1 | 3/2011 | Sako et al. |
| 2012/0068774 A1 | 3/2012 | Chen et al. |
| 2012/0098609 A1 | 4/2012 | Verma et al. |
| 2012/0105162 A1 | 5/2012 | Chou et al. |
| 2012/0154066 A1 | 6/2012 | Kubota |
| 2012/0161889 A1 | 6/2012 | Ozawa et al. |
| 2013/0002365 A1 * | 1/2013 | Zoppi ....................... H03L 5/00 331/158 |
| 2015/0061786 A1 | 3/2015 | Mai |
| 2019/0268002 A1 | 8/2019 | Peltonen et al. |

FOREIGN PATENT DOCUMENTS

| | | |
|---|---|---|
| EP | 2634914 A1 | 9/2013 |
| EP | 2884658 A1 | 6/2015 |
| JP | 2005303639 A | 10/2005 |
| JP | 2006121477 A | 5/2006 |
| WO | 8903617 A1 | 4/1989 |

* cited by examiner

OSCILLATOR CIRCUIT WITH BIAS CURRENT GENERATOR

FIELD OF THE DISCLOSURE

The present disclosure relates to an oscillator circuit, a method of operating an oscillator circuit, and a wireless communication device comprising an oscillator circuit.

BACKGROUND TO THE DISCLOSURE

In electronic systems, such as a radio frequency (RF) transceiver of a mobile phone, a system clock is typically generated using a crystal oscillator. A crystal oscillator comprises an active part and a resonator. The active part comprises an amplifier and is commonly referred to as the oscillator core. The resonator, which comprises a piezoelectric crystal, is coupled between an input of the active part and an output of the active part. The oscillator core may be integrated with a transceiver in an integrated circuit, the crystal being external to the integrated circuit, or the oscillator core and crystal may be implemented in a module, such as a temperature-controlled crystal oscillator (TCXO), external to a transceiver integrated circuit.

Shrinking of the dimensions of piezoelectric crystals has led to an increase of motional loss of the crystal, which can be quantified as an increase in resistive loss, or resistance, of the crystal. The spread of resistance between different crystals is typically large compared to the mean value of resistance averaged over many crystals. Indeed, the maximum value of resistance can be much greater than the mean value. For example, a 26 MHz crystal in an industry standard 2016 size package, which has dimensions 2 mm by 1.6 mm, may have a resistance ranging from 10Ω to 80Ω. This spread makes it challenging to design a crystal oscillator circuit able to cope with the spread of resistance. Additionally, the negative resistance of the oscillator core should be arranged to ensure oscillator start-up, negative resistance being the property whereby a voltage decreases in response to an increasing current, but integrated circuit process variation can result in a spread in the negative resistance of the oscillator core.

There is a requirement for an improved oscillator circuit.

SUMMARY

According to a first aspect there is provided an oscillator circuit comprising a crystal oscillator arranged to generate an oscillation signal; a bias current generator arranged to supply a bias current to the crystal oscillator; and a feedback stage arranged to generate a feedback signal in response to an amplitude of the oscillation signal reaching an amplitude threshold. The bias current generator in these embodiments is arranged to, in response to a supply of power to the oscillator circuit being switched on, generate the bias current at an increasing level commencing at a first level, and in response to the feedback signal, terminate the increasing. During subsequent operation of the crystal oscillator, the bias current generator supplies the bias current at a second level dependent on a final level of the bias current reached when the increasing is terminated.

According to a second aspect there is provided a method of operating an oscillator circuit comprising a crystal oscillator, the method comprising, in response to a supply of power to the oscillator circuit being switched on, generating a bias current at an increasing level commencing at a first level, generating a feedback signal in response to an amplitude of an oscillation signal generated by the crystal oscillator reaching an amplitude threshold, and, in response to the feedback signal, terminating the increasing. The method further includes, during subsequent operation of the crystal oscillator, supplying the bias current at a second level dependent on a final level of the bias current reached when the increasing is terminated.

Therefore, the oscillator circuit and method of operating an oscillator circuit enable the bias current, and consequently the negative resistance of the oscillator core, to be adapted to the resistance of the crystal employed by the crystal oscillator, to enable start-up of oscillation without generating an excessive bias current that may result in unwanted parasitic oscillations, whilst also conserving power. Supplying the bias current during subsequent operation of the crystal oscillator at a level dependent on the final bias current enables stable and power-efficient oscillation, and, during a subsequent switch-on, fast start-up.

The second level may be equal to the final level. This feature enables low complexity.

In some embodiments, the bias current generator may comprise an integrator arranged to generate an increasing ramp voltage, and a current source arranged to increase the level of the bias current responsive to the increasing ramp voltage. Likewise, some embodiments of the method may comprise generating an increasing ramp voltage, and increasing the level of the bias current responsive to the increasing ramp voltage. This feature provides a low complexity way of increasing the level of the bias current, for example where the increase is not required to take place over a long time period, or where the bias current generator is not required to be implemented solely in an integrated circuit.

In some embodiments, the bias current generator may comprise an auxiliary oscillator arranged to generate an auxiliary clock signal, a counter arranged to generate an increasing count value by counting pulses of the auxiliary clock signal, and a current source arranged to increase the level of the bias current responsive to the increasing count value. Likewise, in some of these embodiments, generating the bias current at an increasing level may comprise generating an auxiliary clock signal, generating an increasing count value by counting pulses of the auxiliary clock signal, and increasing the level of the bias current responsive to the increasing count value. This feature enables the bias current to be increased over a long time period, thereby enabling stable operation, and enables a high level of circuit integration.

The auxiliary clock signal generator may comprise an auxiliary oscillator arranged to generate an auxiliary oscillation signal, and a frequency divider arranged to generate the auxiliary clock signal by dividing the auxiliary oscillation signal. Likewise, the method may comprise generating an auxiliary oscillation signal, and generating the auxiliary clock signal by dividing the auxiliary oscillation signal. This feature enables the auxiliary oscillation signal to have a higher frequency than the auxiliary clock signal, thereby reducing the capacitance required by the auxiliary oscillator and consequently enabling reduced area in an integrated circuit.

The bias current generator may further comprise a digital-to-analogue converter arranged to convert the increasing count value to an increasing analogue signal, and the current source may be arranged to increase the level of the bias current responsive to the increasing analogue signal. Likewise, in the method, generating the bias current at an increasing level may comprise converting the increasing count value to an increasing analogue signal, and increasing the level of the bias current responsive to the increasing analogue signal. This feature enables a high level of circuit integration.

The auxiliary clock signal may have a frequency lower than a frequency of the oscillation signal. In particular, the auxiliary clock signal may have a frequency not exceeding one of one tenth, one hundredth and one thousandth of the frequency of the oscillation signal. These features enable start-up of oscillation without generating an excessive bias current that may result in unwanted parasitic oscillations.

The oscillator circuit may comprise a storage device arranged to store an indication of the second level, and the bias current generator may be arranged to, in response to the supply of power to the oscillator circuit being switched on subsequently after being switched off, generate the bias current at a third level dependent on the stored indication. Likewise, the method may comprise storing an indication of the second level, and in response to the supply of power to the oscillator circuit being switched on subsequently after being switched off, generating the bias current at a third level dependent on the stored indication. This feature enables fast start-up at the subsequent switch-on, for example after a sleep period where the oscillator circuit is temporarily powered-down to conserve power.

The third level may be equal to the second level. This feature enables low complexity.

The feedback stage may comprise an amplitude detector arranged to generate an indication of the amplitude of the oscillation signal, and a comparator arranged to generate the feedback signal in response to the indication of the amplitude of the oscillation signal reaching the amplitude threshold. Likewise, in the method, generating the feedback signal may comprise generating an indication of the amplitude of the oscillation signal, and generating the feedback signal in response to the indication of the amplitude of the oscillation signal reaching the amplitude threshold. This feature provides a low complexity way of generating the feedback signal.

According to a third aspect, there is provided a wireless communication device comprising the oscillator circuit.

Embodiments are described, by way of example only, with reference to the accompanying drawings.

DETAILED DESCRIPTION

Figure 1:
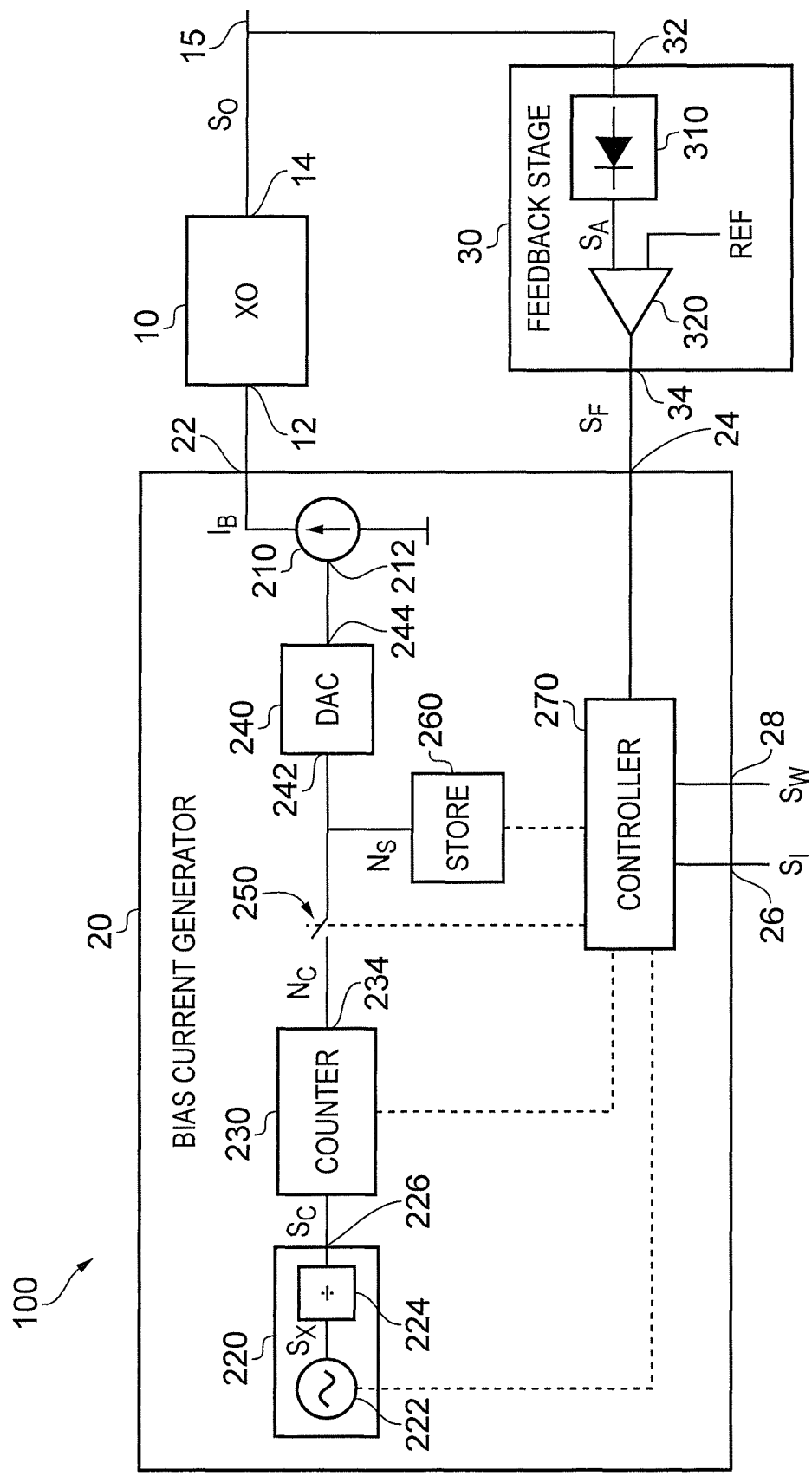
FIG. 1 is a block schematic diagram of an oscillator circuit.

Referring to FIG. 1, a first preferred embodiment of an oscillator circuit 100 comprises a crystal oscillator (XO) 10, a bias current generator 20 and a feedback stage 30. The crystal oscillator 10 has an input 12 coupled to an output 22 of the bias current generator 20 for receiving a bias current $I_B$ generated by the bias current generator 20, and an output 14 coupled to an output 15 of the oscillator circuit 100 for delivering an oscillation signal $S_O$. The feedback stage 30 has an input 32 coupled to the output 14 of the crystal oscillator 10 for receiving the oscillation signal $S_O$, and an output 34 for delivering a feedback signal $S_F$.

The feedback stage 30 comprises an amplitude detector 310 coupled to the input 32 of the feedback stage 30. The amplitude detector 310 generates an indication $S_A$ of the amplitude of the oscillation signal $S_O$. The feedback stage 30 also comprises a comparator 320 coupled to the amplitude detector 310 for receiving the indication $S_A$ of the amplitude of the oscillation signal $S_O$. The comparator 320 is also coupled to an amplitude threshold REF. When the oscillator circuit 100 is powered-up, and consequently the amplitude of the oscillation signal $S_O$ increases from zero, the comparator 320 generates a feedback signal $S_F$ in response to the amplitude of the oscillation signal $S_O$, and therefore the indication $S_A$, reaching the amplitude threshold REF. The comparator 320 is coupled to the output 34 of the feedback stage 30 for delivering the feedback signal $S_F$.

The output 34 of the feedback stage 30 is coupled to a first input 24 of the bias current generator 20. The bias current generator 20 has a second input 26 for an initialisation signal $S_I$, and a third input 28 for a wake-up signal $S_W$. The initialisation signal $S_I$ indicates to the oscillator circuit 100 when the oscillator circuit 100 is required to commence oscillation from an initial power-off state, when initialisation is required, and the wake-up signal $S_W$ indicates when the oscillator circuit 100 is required to commence oscillation from a subsequent power-off state, when initialisation is not required again. Power supply connections to the oscillator circuit 100 are not illustrated in FIG. 1, for clarity. The bias current generator 20 comprises a current source 210 coupled to the output 22 of the bias current generator 20 for generating the bias current $I_B$. The current source 210 has a control input 212 for controlling the magnitude of the bias current, as described below.

The bias current generator 20 comprises an auxiliary clock signal generator 220 that generates an auxiliary clock signal $S_C$. The auxiliary clock signal generator 220 comprises an auxiliary oscillator 222 that generates an auxiliary oscillation signal $S_X$, coupled to a frequency divider 224 that generates the auxiliary clock signal $S_C$ by dividing the auxiliary oscillation signal $S_X$. The frequency divider 224 may have a division ratio of, for example, one hundred, with the auxiliary oscillation signal $S_X$ having a frequency of, for example, 100 kHz and the auxiliary clock signal $S_C$ having a frequency of 1 kHz. An output 226 of the auxiliary clock signal generator 220, corresponding to an output of the frequency divider 224, is coupled to a counter 230 that generates a count value $N_C$ by counting pulses, that is, cycles, of the auxiliary clock signal $S_C$. Therefore, the count value $N_C$ increases in a step-wise manner. In a non-illustrated variant of the bias current generator 20, the frequency divider 224 may be omitted, in which case the output 226 of the auxiliary clock signal generator 220 corresponds to an output of the auxiliary oscillator 222, and is coupled to the counter 230. In this case, the auxiliary oscillation signal $S_X$ is used as the auxiliary clock signal $S_C$, and the auxiliary clock signal $S_C$ has a frequency equal to a frequency of the auxiliary oscillation signal $S_X$, for example 1 kHz.

An output 234 of the counter 230 is coupled to an input 242 of a digital-to-analogue (DAC) converter 240 via a switch 250. A storage device (STORE) 260 is coupled to the input 242 of the DAC 240, and therefore is also coupled to the to the output 234 of the counter 230 via the switch 250. In a first state of the switch 250, in which the switch 250 is closed, that is, is in a conducting state, the count value $N_C$ is delivered from the output 234 of the counter 230 to the input 242 of the DAC 240, and to the storage device 260 for storing the current count value $N_C$. This stored value is denoted $N_S$. In a second state of the switch 250, in which the switch 250 is open, that is, is in a non-conducting state, the output 234 of the counter 230 is de-coupled from the input 242 of the DAC 240, and from the storage device 260, and in this state the stored value $N_S$, instead of the increasing count value $N_C$, is delivered to the input 242 of the DAC 240. Therefore, depending on the state of the switch 250, the storage device 260 is arranged to either store a new count value $N_C$, or to output the stored value $N_S$, as described in detail below. An output 244 of the DAC 240 is coupled to the control input 212 of the current source 210 for controlling the magnitude of the bias current $I_B$ dependent on the increasing count value $N_C$ delivered at the output 234 of the counter 230, or the stored value $N_S$ which is constant, according to the state of the switch 250.

The bias current generator 20 also comprises a controller 270 coupled to the first, second and third inputs 24, 26, 28 of the bias current generator 20 for receiving, respectively, the feedback signal $S_F$, the initialisation signal $S_I$ and the wake-up signal $S_W$. The controller 270 is also coupled to the auxiliary oscillator 220 for starting and stopping generation of the auxiliary clock signal $S_C$, to the counter 230 for starting and resetting the counting of the pulses of the auxiliary clock signal $S_C$, to the switch 250 for controlling whether the switch 250 has the first state or the second state, and to the storage device 260 for initiating storage of the current count value $N_C$ into the storage device 260 and reading of the stored value $N_S$ from the storage device 260.

Figure 2:
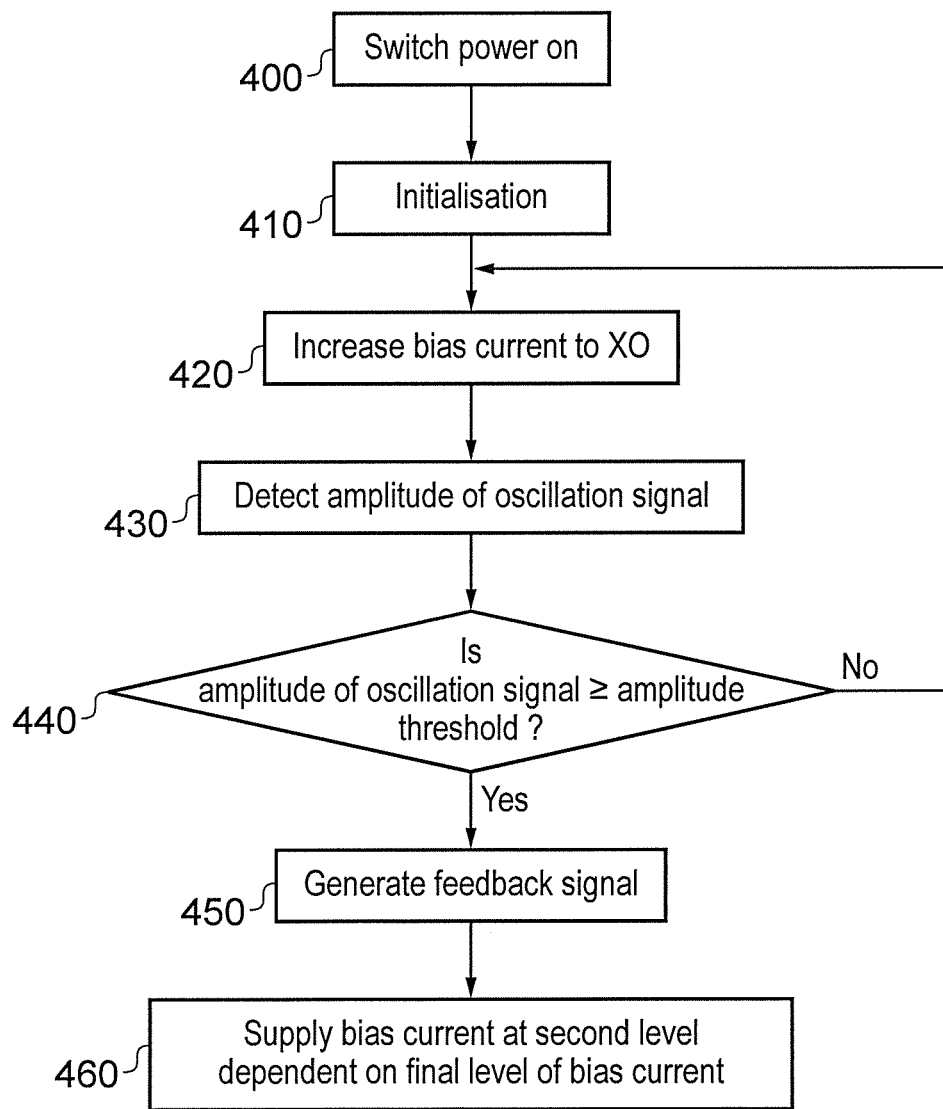
FIG. 2 is a flow chart of a method of operating an oscillator circuit.

Operation of the oscillator circuit 100 is described below with reference to the flow chart of FIG. 2, assuming that the oscillator circuit 100 is initially switched off, that is, is not supplied with power and therefore is not generating the oscillation signal $S_O$ or the auxiliary clock signal $S_C$. At step 400, power is switched on, thereby supplying power to the oscillator circuit 100. This power-on condition is detected in the oscillator circuit 100 by means of the initialisation signal $S_I$ at the second input 26 of the bias current generator 20, which is supplied to the controller 270.

In response to the initialisation signal $S_I$, at step 410 the controller 270 initialises the count value $N_C$ of the counter 230 to zero, sets the switch 250 into the first state, thereby enabling the count value $N_C$ to be routed to the DAC 240, and then enables the auxiliary oscillator 220 to start generating the auxiliary clock signal $S_C$. With the count value $N_C$ initialised to zero, the bias current $I_B$ has a first level that is zero or near zero, being insufficient to sustain oscillation of the crystal oscillator 10 for the expected spread of crystal resistance and the expected spread of negative resistance of the active part.

At step 420, the counter 230 increments in response to receiving a pulse of the auxiliary clock signal $S_C$ from the auxiliary oscillator 220, thereby increasing the count value $N_C$, and consequently increasing the bias current $I_B$ supplied to the crystal oscillator 10. Although the count value $N_C$ increments in a step-wise manner, smoothing may take place in the current source 210 such that the bias current $I_B$ increases in a more gradual manner.

At step 430, the amplitude detector 310 detects the amplitude of the oscillation signal $S_O$ and generates the indication $S_A$ of the amplitude of the oscillation signal $S_O$. This amplitude will be zero if the crystal oscillator 10 has not yet started to oscillate.

At step 440, the comparator 320 compares the indication $S_A$ with the amplitude reference REF. If the indication $S_A$ is less than the amplitude reference REF, the feedback signal $S_F$ is not generated at the output 34 of the feedback stage 30, and flow returns to step 420 where the counter 230 again increments in response to receiving a further pulse of the auxiliary clock signal $S_C$ from the auxiliary oscillator 220, thereby further increasing the count value $N_C$, and consequently further increasing the bias current $I_B$ supplied to the crystal oscillator 10. The loop comprising steps 420, 430 and 440 is repeated, thereby successively increasing the bias current $I_B$ with each iteration. While the count value $N_C$ is low, the bias current $I_B$ may be insufficient to sustain oscillation of the crystal oscillator 10. As the count value $N_C$ increases, the bias current $I_B$ increases to a level sufficient to sustain oscillation of the crystal oscillator 10. As the count value $N_C$ increases further, the bias current $I_B$ increases further, thereby enabling the amplitude of the oscillation signal $S_O$ to increase.

If, at step 440, the comparator 320 determines that the indication $S_A$ is equal to, or greater than, the amplitude reference REF, flow proceeds to step 450 where the feedback signal $S_F$ is generated at the output 34 of the feedback stage 30. Flow then proceeds to step 460.

At step 460, in response to the feedback signal $S_F$, the controller 270 enables the storage device 260 to store the current count value $N_C$, that is $N_S$, and sets the switch 250 into the second state, thereby enabling the stored value $N_S$ to be routed to the DAC 240. Consequently, for subsequent oscillation, the bias current $I_B$ becomes constant at a second level dependent on the stored value $N_S$. Also at step 460, the controller 270 may disable the auxiliary oscillator 220 and the counter 230 in order to conserve power.

The rate of increase of the count value $N_C$, and consequently the rate of increase of the bias current $I_B$ and of the amplitude of the oscillation signal $S_O$, depends on the frequency of the auxiliary clock signal $S_C$, and this frequency may be selected to ensure that the rate of increase of the amplitude of the oscillation signal $S_O$ is sufficiently slow to avoid generation of unwanted parasitic oscillations. For example, if the oscillation signal $S_O$ has a frequency of 26 MHz and the frequency of the auxiliary clock signal $S_C$ is 1 kHz, the oscillation signal $S_O$ will have 26000 cycles for each increment of the count value $N_C$ and each increment of the bias current $I_B$. If, on average, 8 increments are required before the feedback signal $S_F$ is generated, the start-up time will on average be about 8 ms. More generally, the auxiliary clock signal $S_C$ preferably has a frequency lower than the frequency of the oscillation signal $S_O$, for example not exceeding one tenth, or not exceeding one hundredth, or not exceeding one thousandth of the frequency of the oscillation signal $S_O$.

Furthermore, the rate of increase of the amplitude of the oscillation signal $S_O$, and also the bias current required for the oscillation signal $S_O$ to attain the amplitude corresponding to the amplitude reference REF, depends on the characteristics of the crystal oscillator 10, and in particular on the resistance of the crystal employed by the crystal oscillator 10 and on the negative resistance of the oscillator core. Therefore the stored value $N_S$ will also depend on these factors, and is adapted by the oscillator circuit 100 dependent on these factors.

For subsequent powering-on of the oscillator circuit 100, after an intervening power-off period in which power to the oscillator circuit 100 is switched off, the level of the bias current $I_B$ may be established dependent on the stored value $N_S$, without requiring to perform the initialisation process of increasing the bias current $I_B$ in response to the increasing count value $N_C$. Therefore, subsequent start-up of the oscillator circuit 100 may be faster than the start-up when the initialisation process is performed. In this case, the storage device 260 should be non-volatile, retaining the stored value $N_S$ while power is switched off. The initialisation process may be performed when power to the oscillator circuit 100 is switched from off to on, for example during manufacture of the oscillator circuit 100 or manufacture of a device comprising the oscillator circuit 100, or when a user of a device comprising the oscillator circuit 100 initiates powering-on by pushing a power-on button. In a mobile phone, for example, it may be acceptable for such initialisation of the oscillator circuit 100 to take 10 ms. For subsequent powering-on of the oscillator circuit 100 when the count value $N_C$ has previously been stored as the stored value $N_S$, for example when the oscillator circuit 100 or a device comprising the oscillator circuit 100 wakes up from a sleep mode, initialisation is not required and the level of the bias current $I_B$ may be established dependent on the stored value $N_S$. In a mobile phone, for example, such a wake-up may be performed within 1 ms.

Although at step 460 the current count value $N_C$ is stored in the storage device 260, in a variant of the oscillator circuit 100, the storage device 260 and the switch 250 may be omitted and, under the control of the controller 270, the counter 230 may cease counting and retain the final count value $N_C$ reached, with this final count value $N_C$ being delivered to the input 242 of the DAC 240 for subsequent oscillation of the crystal oscillator 10. This variant is suitable in circumstances where, for example, the initialisation is performed every time the oscillator circuit 100 is powered-up and the time required to perform the initialisation on each such occasion is tolerable.

Although at step 460 the current count value $N_C$ is stored, corresponding to the final count value $N_C$, and consequently corresponding to the final level of the bias current $I_B$, reached when the increasing is terminated, in a variant of the oscillator circuit 100 the stored value $N_S$ may be different from the final count value $N_C$, and in particular may be lower than the final count value $N_C$ by a predetermined amount, for example by a single increment. This variant may be employed in circumstances where the amplitude of the oscillation signal $S_O$ may overshoot a desired maximum value during the increasing of the bias current $I_B$ due to the count value $N_C$ being quantised. In this case, the bias current $I_B$ supplied during subsequent operation of the crystal oscillator 10, and which is dependent on the stored value $N_S$, may be lower than the final level of the bias current $I_B$ reached when the increasing is terminated, thereby ensuring the amplitude of the oscillation signal $S_O$ does not exceed the desired maximum, but nevertheless is dependent on this final level. More generally, during subsequent operation of the crystal oscillator 10, that is, after the initialisation process, the bias current $I_B$ is supplied at a second level dependent on, and optionally but not necessarily equal to, the final level of the bias current $I_B$ reached when the increasing of the bias current $I_B$ is terminated. Likewise, when the oscillator circuit 100 is subsequently powered-on, after an intervening power-off period in which power to the oscillator circuit 100 is switched off, and the bias current $I_B$ is dependent on the stored value $N_S$, rather than being determined by performing the initialisation process of increasing the bias current $I_B$, the bias current $I_B$ may be at a third level dependent on the stored value $N_S$, the third level being optionally but not necessarily equal to the final level of the bias current $I_B$ reached when the increasing of the bias current $I_B$ is terminated during the initialisation process. The second and third levels may be equal.

Figure 3:
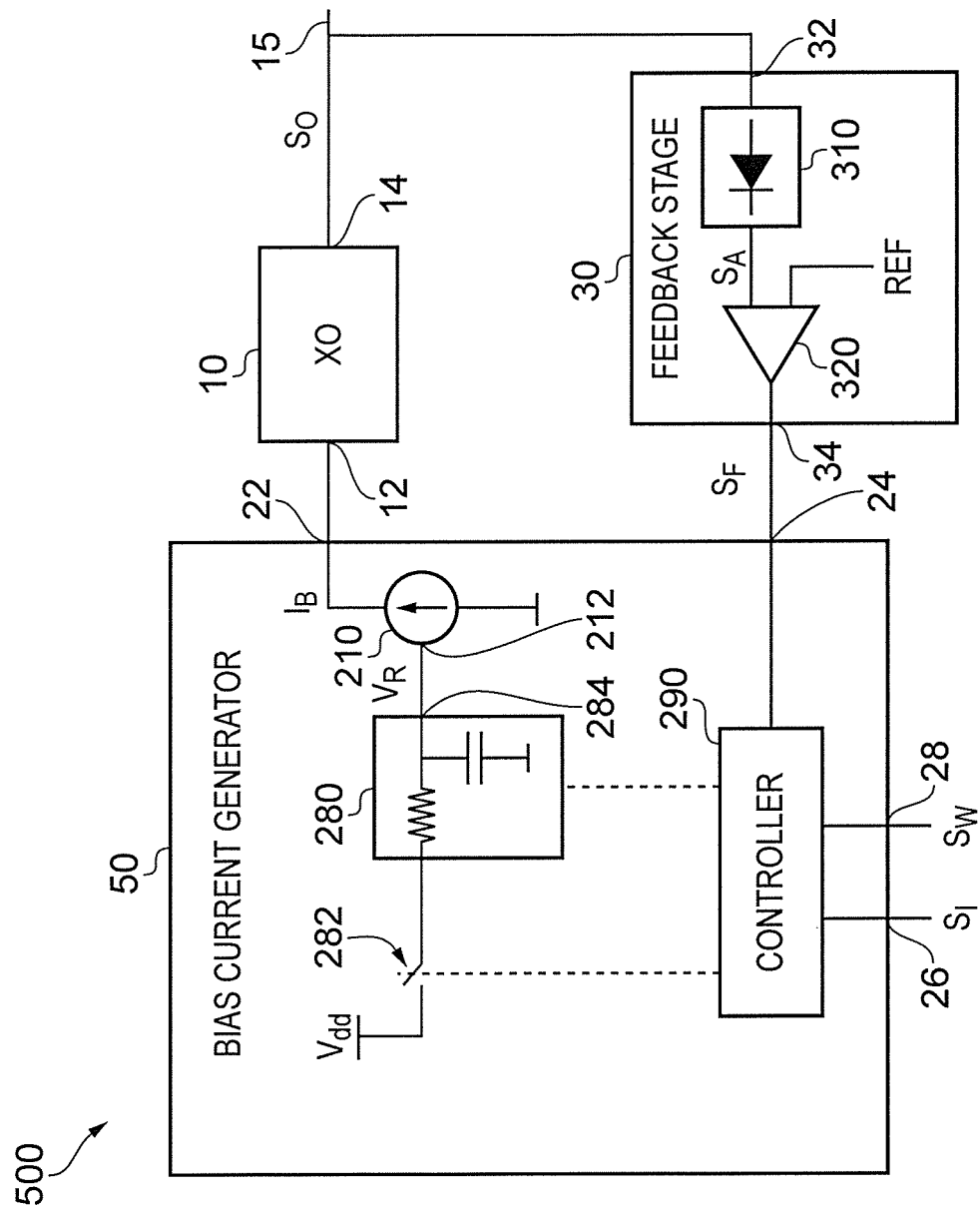
FIG. 3 is a block schematic diagram of an oscillator circuit.

Referring to FIG. 3, a second preferred embodiment of an oscillator circuit 500 comprises the crystal oscillator 10 and the feedback stage 30 as described with reference to FIG. 1 coupled to a bias current generator 50 that has the same inputs and outputs as the bias current generator 20 described with reference to FIG. 1, but a different internal architecture. Therefore, the description in the following paragraphs of the oscillator circuit 500 is focussed principally on the internal architecture of the bias current generator 50. The crystal oscillator 10 and the feedback stage 30 and their connections are not described again.

The bias current generator 50 comprises an integrator 280 coupled to a power supply voltage $V_{dd}$ via a switch 282. In FIG. 3, the integrator 280 is illustrated as a simple resistor-capacitor (RC) network, but other integration circuits may alternatively be used. In response to the switch 282 closing, the integrator 280 generates an increasing ramp voltage $V_R$ at an output 284 of the integrator 280. The bias current generator 50 also comprises the current source 210, and the output 284 of the integrator 280 is coupled to the control input 212 of the current source 210 which therefore generates the bias current $I_B$ having a level, that is, magnitude, dependent on the ramp voltage $V_R$. Therefore, the bias current $I_B$ increases as the ramp voltage $V_R$ at the control input 212 of the current source 210 increases.

The bias current generator 50 also comprises a controller 290 coupled to the first, second and third inputs 24, 26, 28 of the bias current generator 50 for receiving, respectively, the feedback signal $S_F$, the initialisation signal $S_I$ and the wake-up signal $S_W$. The controller 290 is also coupled to the switch 282 for controlling the starting and stopping of the generation of the ramp voltage $V_R$, and to the integrator 280 for resetting any voltage stored in the integrator 280 to zero or a low value.

Operation of the bias current generator 50 is described below assuming that the oscillator circuit 500 is initially switched off, that is, is not supplied with power and therefore is not generating the oscillation signal $S_O$, and that the switch 282 is initially open, that is, is in a non-conducting state. In response to the initialisation signal $S_I$, the controller 290 resets the voltage stored in the integrator 280 and closes the switch 282. The voltage stored in the integrator 280 starts to increase, thereby providing the ramp voltage $V_R$, and consequently the bias current $I_B$ starts to increase in level from a first level which may be zero or small, being insufficient to sustain oscillation of the crystal oscillator 10. When the amplitude of the oscillation signal $S_O$ reaches the amplitude reference REF, the feedback signal $S_F$ is generated by the feedback stage 30. In response to the feedback signal $S_F$, the controller 280 opens the switch 282. Consequently, the ramp voltage $V_R$ stops increasing, and the final level reached by the ramp voltage $V_R$ is stored in the integrator 280, thereby causing the bias current $I_B$ to cease increasing and become constant at a second level, corresponding to the final level of the ramp voltage $V_R$.

In response to the wake-up signal $S_W$, when the oscillator circuit 500 is required to commence oscillation from a subsequent power-off state, when initialisation is not required again, the level of the bias current $I_B$ is constant at the second level, being dependent on the voltage stored in the integrator 280.

The rate of increase of the bias current $I_B$ while the ramp voltage $V_R$ is increasing, and consequently the rate of increase of the amplitude of the oscillation signal $S_O$, depends on the integration time constant of the integrator 280, and this time constant may be selected to be sufficiently slow to avoid generation of unwanted parasitic oscillations.

Figure 4:
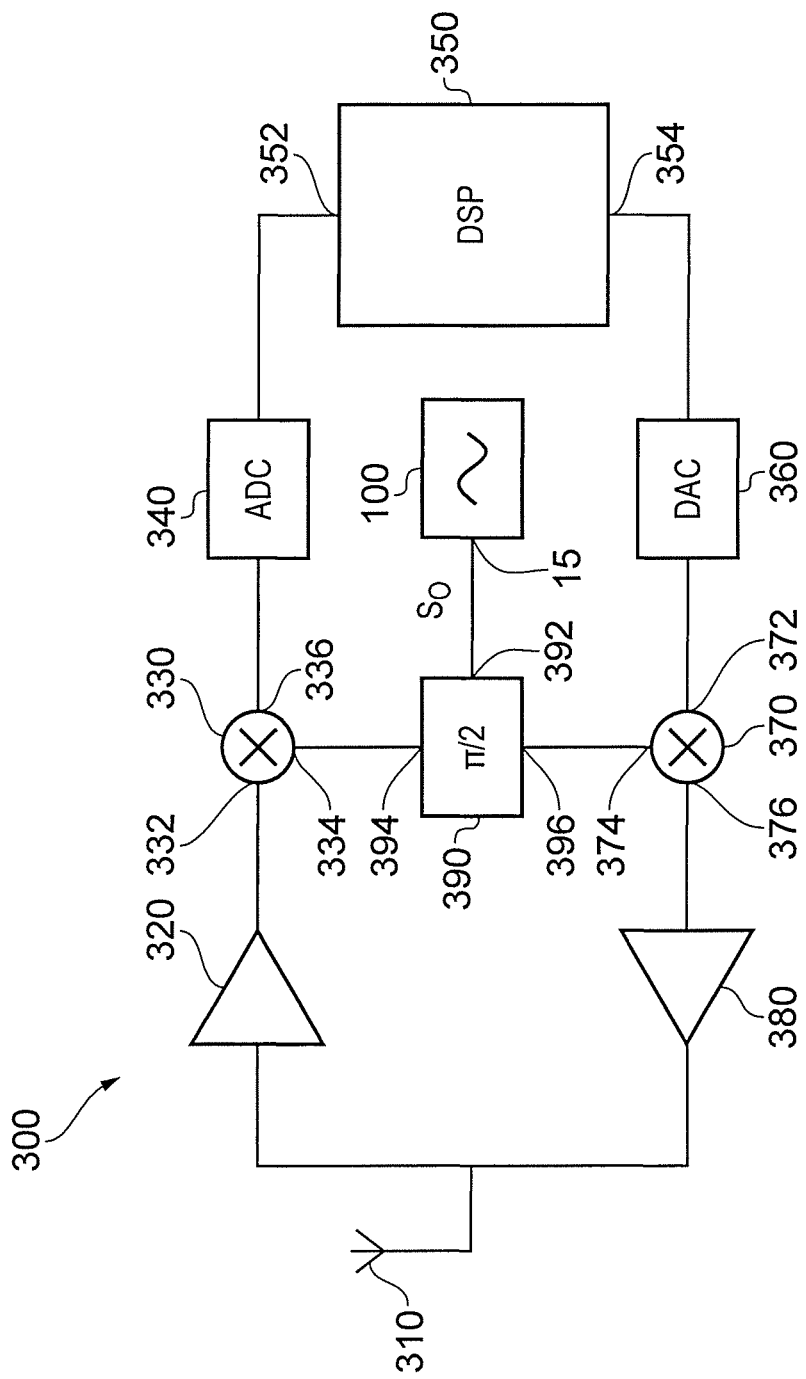
FIG. 4 is a block schematic diagram of a wireless communication device.

Referring to FIG. 4, a wireless communication device 300 comprises an antenna 310 coupled to an input of a low noise amplifier 320 for amplifying an RF signal received by the antenna 310. An output of the low noise amplifier 320 is coupled to a first input 332 of a down-conversion stage 330 for down-converting the amplified RF signal to baseband by mixing the amplified RF signal with quadrature related components of a local oscillator signal present at a second input 334 of the down-conversion stage 330. After the down-conversion, therefore, the baseband signal comprises quadrature related components. An output 336 of the down-conversion stage 330 is coupled to an input 352 of a digital signal processor (DSP) 350 via an analogue-to-digital converter (ADC) 340 that digitises the quadrature related components of the baseband signal. The DSP 350 demodulates and decodes the digitised baseband signal. The DSP 350 also generates, at an output 354 of the DSP 350, quadrature related components of a baseband signal for up-conversion. The output 354 of the DSP 350 is coupled to a first input 372 of an up-conversion stage 370 via a DAC 360. The up-conversion stage 370 up-converts the baseband signal to RF for transmission by mixing the quadrature related components of the baseband signal with quadrature related components of the local oscillator signal present at a second input 374 of the up-conversion stage 370. An output 376 of the up-conversion stage 370 is coupled to the antenna 310 via a power amplifier 380 that amplifies the RF signal for transmission. The wireless communication device 300 comprises the oscillator circuit 100, or alternatively may comprise the oscillator circuit 500. The output 15 of the oscillator circuit 100 is coupled to an input 392 of a phase shifting element 390. The phase shifting element 390 generates from the oscillation signal $S_O$ quadrature related components of the local oscillator signal at both a first output 394 and also at a second output 396 of the phase shifting element 390. The first output 394 of the phase shifting element 390 is coupled to the second input 334 of the down-conversion stage 330 for delivering the quadrature related components of a local oscillator signal to the down-conversion stage 330, and the second output 396 of the phase shifting element 390 is coupled to the second input 374 of the up-conversion stage 370 for delivering the quadrature related components of the local oscillator signal present to the up-conversion stage 370.

Although embodiments have been described in which the stored value $N_S$, and the stored final value of the ramp voltage $V_R$ are constant, these stored values may be updated by repeating the initialisation process. Moreover, these stored values may be updated by an automatic gain control (AGC) scheme in response to fluctuations in the amplitude of the oscillation signal $S_O$, in order to restore the amplitude of the oscillation signal $S_O$ to a target level. Nonetheless, such updated values remain dependent on the final level of the bias current $I_B$ reached when the increasing of the level of the bias current $I_B$ is terminated.

Other variations and modifications will be apparent to the skilled person. Such variations and modifications may involve equivalent and other features which are already known and which may be used instead of, or in addition to, features described herein. For example, although apparatus and methods for generating the increasing bias current $I_B$ have been described, other techniques may alternatively be used.

Features that are described in the context of separate embodiments may be provided in combination in a single embodiment. Conversely, features which are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims. It should also be noted that where a component is described as being "arranged to" or "adapted to" perform a particular function, it may be appropriate to consider the component as merely suitable "for" performing the function, depending on the context in which the component is being considered. Throughout the text, these terms are generally considered as interchangeable, unless the particular context dictates otherwise. It should also be noted that the Figures are not necessarily to scale; emphasis instead generally being placed upon illustrating the principles of the present invention.

What is claimed is:

1. An oscillator circuit comprising:
   a crystal oscillator configured to generate an oscillation signal;
   a bias current generator configured to supply a bias current to the crystal oscillator; and
   a feedback stage configured to generate a feedback signal in response to an amplitude of the oscillation signal reaching an amplitude threshold;
   wherein the bias current generator is configured to:
      in response to a supply of power to the oscillator circuit being switched on, generate the bias current at an increasing level commencing at a first level,
      in response to the feedback signal, terminate the increasing, and
      during subsequent operation of the crystal oscillator, supply the bias current at a second level dependent on a final level of the bias current reached when the increasing is terminated;
   wherein the oscillator circuit further comprises a storage device configured to store an indication of the final level, and wherein the bias current generator is configured to, in response to the supply of power to the oscillator circuit being switched on subsequently after being switched off, generate the bias current at a third level dependent on the stored indication.

2. The oscillator circuit of claim 1, wherein the second level is equal to the final level.

3. The oscillator circuit of claim 1, wherein the bias current generator comprises:
   an integrator configured to generate an increasing ramp voltage; and
   a current source configured to increase the level of the bias current responsive to the increasing ramp voltage.

4. The oscillator circuit of claim 1, wherein the bias current generator comprises:
   an auxiliary clock signal generator configured to generate an auxiliary clock signal;
   a counter configured to generate an increasing count value by counting pulses of the auxiliary clock signal; and
   a current source configured to increase the level of the bias current responsive to the increasing count value.

5. The oscillator circuit of claim 4, wherein the auxiliary clock signal generator comprises:
   an auxiliary oscillator configured to generate an auxiliary oscillation signal; and
   a frequency divider configured to generate the auxiliary clock signal by dividing the auxiliary oscillation signal.

6. The oscillator circuit of claim 4, wherein the bias current generator further comprises a digital-to-analog converter configured to convert the increasing count value to an increasing analog signal, and wherein the current source is configured to increase the level of the bias current dependent on the increasing analog signal.

7. The oscillator circuit of claim 4, wherein the auxiliary clock signal has a frequency lower than a frequency of the oscillation signal.

8. The oscillator circuit of claim 4, wherein the auxiliary clock signal has a frequency not exceeding one of one tenth, one hundredth and one thousandth of a frequency of the oscillation signal.

9. The oscillator circuit of claim 1, wherein the third level is equal to the second level.

10. The oscillator circuit of claim 1, wherein the feedback stage comprises an amplitude detector configured to generate an indication of the amplitude of the oscillation signal, and a comparator configured to generate the feedback signal in response to the indication of the amplitude of the oscillation signal reaching the amplitude threshold.

11. A wireless communication device comprising the oscillator circuit of claim 1.

12. A method of operating an oscillator circuit, comprising:

in response to a supply of power to the oscillator circuit being switched on, generating a bias current at an increasing level commencing at a first level;

supplying the bias current to a crystal oscillator;

generating a feedback signal in response to an amplitude of an oscillation signal generated by the crystal oscillator reaching an amplitude threshold;

in response to the feedback signal, terminating the increasing;

during subsequent operation of the crystal oscillator, supplying the bias current at a second level dependent on a final level of the bias current reached when the increasing is terminated; and storing an indication of the final level, and in response to the supply of power to the oscillator circuit being switched on subsequently after being switched off, generating the bias current at a third level dependent on the stored indication.

13. The method of claim 12, wherein generating the bias current at an increasing level comprises:

generating an auxiliary clock signal;

generating an increasing count value by counting pulses of the auxiliary clock signal; and increasing the level of the bias current responsive to the increasing count value.

* * * * *